US008933550B2

(12) United States Patent
Xue et al.

(10) Patent No.: US 8,933,550 B2
(45) **Date of Patent: *Jan. 13, 2015**

(54) STRUCTURE OF MIXED SEMICONDUCTOR ENCAPSULATION STRUCTURE WITH MULTIPLE CHIPS AND CAPACITORS

(75) Inventors: Yan Xun Xue, Los Gatos, CA (US); Anup Bhalla, Santa Clara, CA (US); Jun Lu, San Jose, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 367 days.

This patent is subject to a terminal disclaimer.

(21) Appl. No.: 13/442,757

(22) Filed: Apr. 9, 2012

(65) Prior Publication Data

US 2012/0193695 A1 Aug. 2, 2012

Related U.S. Application Data

(60) Division of application No. 12/693,446, filed on Jan. 26, 2010, now Pat. No. 8,178,954, which is a continuation-in-part of application No. 12/534,057, filed on Jul. 31, 2009, now Pat. No. 8,164,199.

(51) Int. Cl.

| | |
|---|---|
| ***H01L 23/22*** | (2006.01) |
| ***H01L 29/40*** | (2006.01) |
| ***H01L 23/495*** | (2006.01) |
| ***H01L 23/00*** | (2006.01) |

(52) U.S. Cl.

CPC .... *H01L 23/49575* (2013.01); *H01L 23/49562* (2013.01); *H01L 23/49589* (2013.01); *H01L 24/39* (2013.01); *H01L 24/40* (2013.01); *H01L 24/41* (2013.01); *H01L 24/49* (2013.01); *H01L 24/73* (2013.01); *H01L 24/48* (2013.01); *H01L 2224/48091* (2013.01); *H01L 2224/48137* (2013.01); *H01L 2224/48247* (2013.01); *H01L 2224/48257* (2013.01); *H01L 2224/49111* (2013.01); *H01L 2224/49171* (2013.01); *H01L 2224/49175* (2013.01); *H01L 2224/49177* (2013.01); *H01L 2224/73219* (2013.01); *H01L 2225/06562* (2013.01); *H01L 2924/01005* (2013.01); *H01L 2924/01015* (2013.01); *H01L 2924/01027* (2013.01); *H01L 2924/01082* (2013.01); *H01L 2924/13091* (2013.01); *H01L 2924/19041* (2013.01); *H01L 2924/19104* (2013.01); *H01L 2924/19105* (2013.01); *H01L 2924/30107* (2013.01); *H01L 2924/01006* (2013.01); *H01L 2924/01033* (2013.01); *H01L 2224/73221* (2013.01); *H01L 2224/32145* (2013.01); *H01L 2224/32245* (2013.01); *H01L 2224/73265* (2013.01)

USPC ............................ 257/686; 257/666; 257/777

(58) Field of Classification Search

USPC ........................................................ 257/777

See application file for complete search history.

(56) References Cited

U.S. PATENT DOCUMENTS 7,569,920 B2 * 8/2009 Otremba et al. .............. 257/686
7,732,929 B2 * 6/2010 Otremba et al. .............. 257/777

(Continued)

*Primary Examiner* — James Mitchell

(74) *Attorney, Agent, or Firm* — Chein-Hwa Tsao; CH Emily LLC

(57) ABSTRACT

A semiconductor package for power converter application comprises a low-side MOSFET chip and a high-side MOSFET chip stacking one over the other. The semiconductor package may further enclose a capacitor whereas the capacitor may be a discrete component or an integrated component on chip level with the low-side MOSFET. The semiconductor package may further comprise a PIC chip to provide a complete power converter on semiconductor chip assembly package level.

8 Claims, 12 Drawing Sheets

(56) References Cited

U.S. PATENT DOCUMENTS

| | | | | |
|---|---|---|---|---|
| 8,164,199 | B2 * | 4/2012 | Bhalla et al. | 257/777 |
| 8,466,561 | B2 * | 6/2013 | Otremba | 257/777 |
| 2008/0061396 | A1 * | 3/2008 | Havanur | 257/500 |
| 2009/0108467 | A1 * | 4/2009 | Otremba | 257/777 |
| 2010/0019391 | A1 * | 1/2010 | Strzalkowski | 257/777 |

* cited by examiner

STRUCTURE OF MIXED SEMICONDUCTOR ENCAPSULATION STRUCTURE WITH MULTIPLE CHIPS AND CAPACITORS

This application is a divisional application of co-pending U.S. application entitled "Structure of Mixed Semiconductor Encapsulation Structure with Multiple Chips and Capacitors", with application Ser. No. 12/693,446 and filing date of Jan. 26, 2010. In turn is a CIP of co-pending U.S. application Ser. No. 12/534,057 filed on Apr. 16, 2009.

TECHNICAL FIELD

This invention relates to a semiconductor encapsulation structure, especially referring to a mixed structure of circuit elements such as multiple chips and capacitors encapsulated into same semiconductor package.

BACKGROUND

As shown in FIG. 1, in circuit diagram of a power converter formed by two N-channel MOSFETs, high-side MOSFET (HS) drain electrode D1 connects to port Vin, its source electrode 51 connects to drain electrode D2 of low-side MOSFET (LS), and the source electrode S2 of low-side MOSFET connects to ground Gnd. Generally, a bypass capacitor C is in parallel with Vin-Gnd of this power converter. The capacitor is used to suppress the voltage surge while the power converter turns on to improve its performance. Further more, as shown in FIG. 2, a power converter control IC (PIC) is connected with gate G1 of high-side MOSFET and gate G2 of low-side MOSFET, forming a DC-DC converter.

It is desirable to package both the high side and low side MOSFETs into one package to reduce the component count and reduce space in assembling a DC-DC converter. It is further desirable that the bypass capacitor C be placed closely to the two N-channel MOSFETs in order to minimize parasitic inductance therefore improve the suppression effect of voltage surge.

Thus there is a need for a new semiconductor package to encapsulate both high side and low side MOSFETs for power converter application. There is a further need for a new semiconductor mixed package structure which encapsulates the two MOSFETs and the bypass capacitor for power converter application, or even encapsulates the PIC into the same semiconductor package to form a complete power converter or DC-DC converter therefore effectively reduce the distance between different circuit components, improve the performance of power converter and also shrink the size of whole semiconductor package structure.

SUMMARY OF INVENTION

The purpose of this invention is to provide a semiconductor package structure that encapsulates multiple chips. The package structure may further encapsulate multiple chips and capacitors to provide a mixed semiconductor package, which may encapsulate multiple semiconductor chips and a bypass capacitor into a semiconductor package to form a semiconductor power converter and effectively improve its performance while reducing the size of semiconductor encapsulation.

The semiconductor encapsulation structure may comprise a lead frame with a die pad and a plurality of pins, whereas the pins may comprise a low-side gate pin, a low-side source electrode pin, a high-side gate pin, and a high-side drain electrode pin, the low-side gate pin, the low-side source electrode pin, the high-side gate pin, and the high-side drain electrode pin are separated from the die pad without electrical connection;

a high-side MOSFET chip and a low-side MOSFET chip of the same type having a bottom drain electrode area, a top gate area, and a top source electrode area respectively, whereas the bottom drain electrode of the low-side MOSFET chip is attached onto the die pad to form electrical connection, the top gate area of low-side MOSFET chip is connected to the low-side gate pin via metallic connector to form electrical connection and the top source electrode area of low-side MOSFET chip is connected to the low-side source electrode pin via metallic connector to form electrical connection.

The high-side MOSFET chip may stack on the low-side MOSFET chip with the bottom drain electrode of high-side MOSFET chip stacking above but insulated from the top source electrode of low-side MOSFET chip. In a preferred embodiment of this invention, the insulation between the top source electrode of low-side MOSFET and the bottom drain electrode of high-side MOSFET is provided by a vertical capacitor sandwiched between the low-side MOSFET and high-side MOSFET, with a bottom electrode on its bottom surface connected to the top source electrode area of low-side MOSFET chip and a top electrode on its top surface connected onto the bottom drain electrode area of high-side MOSFET chip. In another preferred embodiment, the insulation is provided by a dielectric layer disposed over a source metal layer functioning as the top source electrode of low-side MOSFET chip. In one embodiment the low-side MOSFET source electrode, the dielectric layer and the high-side MOSFET drain electrode formed by a metal layer disposed over the drain region of high-side MOSFET chip constitutes a capacitor sandwiched between the stacking structure of the low-side MOSFET and high-side MOSFET. In another embodiment the capacitor is integrated with the low-side MOSFET on chip level. In one preferred embodiment, a first metal layer is disposed over the dielectric layer on top of the low-side MOSFET source electrode. The source electrode, the dielectric layer and the first metal layer constitute a vertical capacitor integrated on top of the low-side MOSFET chip. The first metal layer functioning as the top electrode of the capacitor may have an area smaller than the top source electrode area of low-side MOSFET chip but larger than an area of the drain electrode of high-side MOSFET chip. The top electrode of the capacitor may further link to the high-side drain electrode pin via metallic connector to form electrical connection. The top gate area of high-side MOSFET chip is connected to high-side gate pin via metallic connector to form electrical connection. The top source electrode area of high-side MOSFET chip is connected to the die pad via metallic connector, making the top source electrode of high-side MOSFET chip electrical connected to the bottom drain electrode of low-side MOSFET chip, thus forming a multi-chip package for power converter application.

In another preferred embodiment for this invention, the semiconductor encapsulation structure may further comprise a horizontal capacitor disposed side by side with the high-side MOSFET chip on top of the low-side MOSFET chip, with a first electrode at one end attached onto the first metallic layer forming electrical connection with the drain electrode of high-side MOSFET chip, and a second electrode at the opposite end attached onto a portion of the top source electrode area uncovered by the dielectric layer for low-side MOSFET chip forming electrical connection with top source electrode of low-side MOSFET chip.

In this embodiment, the semiconductor encapsulation structure may further comprise a second metallic layer, located on a portion of the top source electrode area uncovered by the first metallic layer for low-side MOSFET chip, to form electrical connection with the top source electrode of low-side MOSFET chip. Also, the second metallic layer is set separately from the first metallic layer without electrical connection. A metal connection such as a bonding wire is connected between the top source electrode of the low-side MOSFET chip and the low-side source electrode pins with one end of the metallic connector bonded to the low-side source electrode pin, and the other end bonded to the second metallic layer. In another embodiment, one end electrode of the horizontal capacitor is bonded to the first metallic layer, and the other end electrode of the horizontal capacitor is bonded onto the second metallic layer.

In another preferred embodiment for this invention, the semiconductor encapsulation structure may further comprise a PIC chip in connection with the gates of the low-side MOSFET chip and the high-side MOSFET chip, to form a DC-DC converter package. In this embodiment, the lead frame may further comprise a PIC die pad and a plurality of PIC pins. The PIC chip is attached onto the PIC die pad. By using metallic connector, such as bond wire, this PIC chip is connected to a plurality of PIC pins and to the gate area of low-side MOSFET chip and the gate area of high-side MOSFET chip, or, this PIC chip may also be connected respectively to a plurality of PIC pins, the low-side gate pin and the high-side gate pin via metallic connectors.

In one preferred embodiment for this invention, the metallic connectors are metallic bonding wires. In another preferred embodiment for this invention, the metallic connectors are metallic plates or ribbons.

This invention also provides another semiconductor encapsulation structure of multiple chips with or without capacitors. The structure of this semiconductor encapsulation comprises:

a lead frame with a die pad and a plurality of pins comprising a low-side gate pin, a low-side source electrode pin, a high-side gate pin and a high-side drain electrode pin, whereas the low-side gate pin, low-side source electrode pin, high-side gate pin, and high-side drain electrode pin are all separated from the die pad without electrical connection; whereas the high-side drain pin further comprises an extension area having a step down;

a high-side MOSFET chip and a low-side MOSFET chip of the same type each having a bottom drain electrode area, a top gate area, and a top source electrode area respectively, whereas the high-side MOSFET chip is disposed on the extension area of high-side drain pin with the bottom drain electrode of high-side MOSFET chip connected to the high-side drain electrode pin to form electrical connection, the top gate area of high-side MOSFET chip is connected to the high-side gate pin via metallic connector to form electrical connection. The high-side MOSFET chip has a thickness substantially the same as a depth of the step down of the high-side drain pin extension area from a top surface of the die pad. Therefore the top source electrode of high-side MOSFET is substantially coplanar to the top surface of the die pad.

A portion of the bottom drain electrode of the low-side MOSFET chip is attached onto the die pad to form electrical connection. Another portion of the bottom drain electrode area of low-side MOSFET chip may extend beyond an edge of the die pad and stack over a portion of the top source electrode area of high-side MOSFET chip establishing electrical connection between the drain electrode of low-side MOSFET chip and the top source electrode of high-side MOSFET chip. The top gate area of low-side MOSFET chip is connected to the low-side gate pins via metallic connector to form electrical connection. The top source electrode area of low-side MOSFET chip is connected to the low-side source electrode pin via metallic connector to form electrical connection, thus forming a package for power converter application.

In another preferred embodiment for this invention, the semiconductor encapsulation structure may further comprise an optional capacitor. In one embodiment, the optional capacitor is a discrete vertical capacitor stacking on top of the low-side MOSFET chip with low-side MOSFET source electrode connected to a bottom electrode of the capacitor; in another embodiment the optional capacitor is integrated with the low-side MOSFET on chip level; in another embodiment the low-side MOSFET source electrode further functions as an electrode of the integrated capacitor; in another embodiment the optional capacitor is configured by the low-side MOSFET source electrode, a dielectric layer disposed over the source electrode and a metal layer disposed over the dielectric layer.

In another preferred embodiment of this invention, the optional capacitor may be a horizontal capacitor disposed side by side with the high-side and low-side MOSFET stacking structure with one end electrode connected onto the low-side source electrode pin to form electrical connection with the source electrode of low-side MOSFET chip, and the other end electrode connected onto the high-side drain electrode pin to form electrical connection with the drain electrode of high-side MOSFET chip.

In another preferred embodiment for this invention, the semiconductor encapsulation structure may further comprise a PIC chip connected with the gate of low-side MOSFET chip and that of high-side MOSFET chip, to form a DC-DC converter. In this embodiment, the lead frame also comprises a PIC die pad and a plurality of PIC pins. The PIC chip is bonded onto the PIC die pad. By using metallic connectors, the PIC chip is connected to a plurality of PIC pins, gate area of low-side MOSFET chip and gate area of high-side MOSFET chip, or, the PIC chip is connected onto a plurality of PIC pins, low-side gate pins, and high-side gate pins via metallic connectors.

In a preferred embodiment for this invention, the metallic connectors are metallic bonding wires. In another preferred embodiment for this invention, the metallic connectors are metallic plates or ribbons.

The mixed semiconductor encapsulation structures with multiple chips and capacitors provided in this invention provide the following technical benefits:

1. to encapsulate two MOSFET chips into one package therefore reduce the component count and reduce space in assembling a DC-DC converter.
2. To encapsulate two MOSFET chips and a bypass capacitor into same semiconductor package for power converter application. The bypass capacitor is disposed closely to the MOSFET chip and thus the parasitic inductance is minimized therefore effectively improving the performance of power converter while greatly reducing the size of the whole semiconductor encapsulation structure.
3. Furthermore, to encapsulate two MOSFET chips, a bypass capacitor and a PIC chip into the same semiconductor package to form a complete DC-DC converter. The bypass capacitor is disposed closely to the MOSFET chips and the parasitic inductance is minimized, thus effectively improving the performance of DC-DC converter while greatly reducing the size of the whole semiconductor encapsulation structure.

DETAIL DESCRIPTION

Based on FIGS. 1~10, some preferred embodiments of invention are described in details, so that the technical scheme and beneficial effect about this invention can be better understood.

The power converter provided in this invention comprises two MOSFET chips of the same type. That is, two N-channel MOSFET chips or two P-channel MOSFET chips. However, the required size of N-channel MOSFET chip is usually smaller than that for P-channel MOSFET chip for the same applications, therefore having smaller resistance. In the cases below, two N-channel MOSFET chips are used as embodiments and are designated as high-side MOSFET chip and low-side MOSFET chip respectively, to describe in detail the structure features in semiconductor encapsulation so that the benefits and effects in this invention can be better understood. Meanwhile, the high-side and low-side MOSFET chip each has a bottom drain electrode, a top source electrode, and a top gate respectively. The size of high-side MOSFET chip is smaller than that of low-side MOSFET chip. It should be noted that the specific description and instance are not used to restrict the scope of this invention.

Embodiment 1

In this embodiment, the high-side MOSFET chip is stacked onto the low-side MOSFET chip, and connected in parallel with the bypass capacitor, and corresponding electrical connections are established by using connecting wires. Finally these three electrical components are encapsulated into a semiconductor package, thus forming the power converter shown in FIG. 1.

Figure 1:
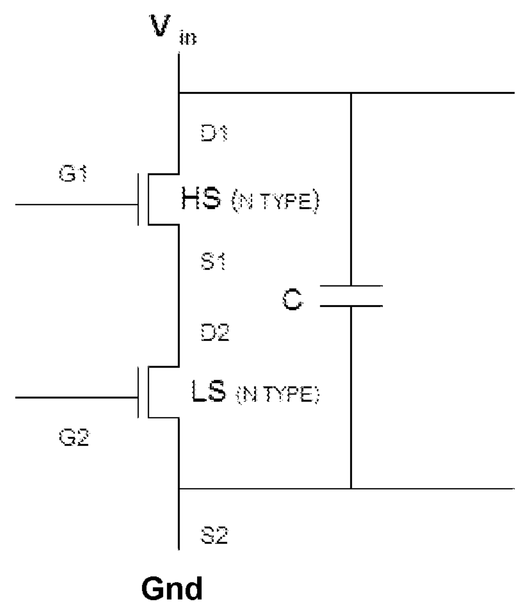
FIG. 1 is a circuit diagram of a power converter in this invention.
Figure 3A:
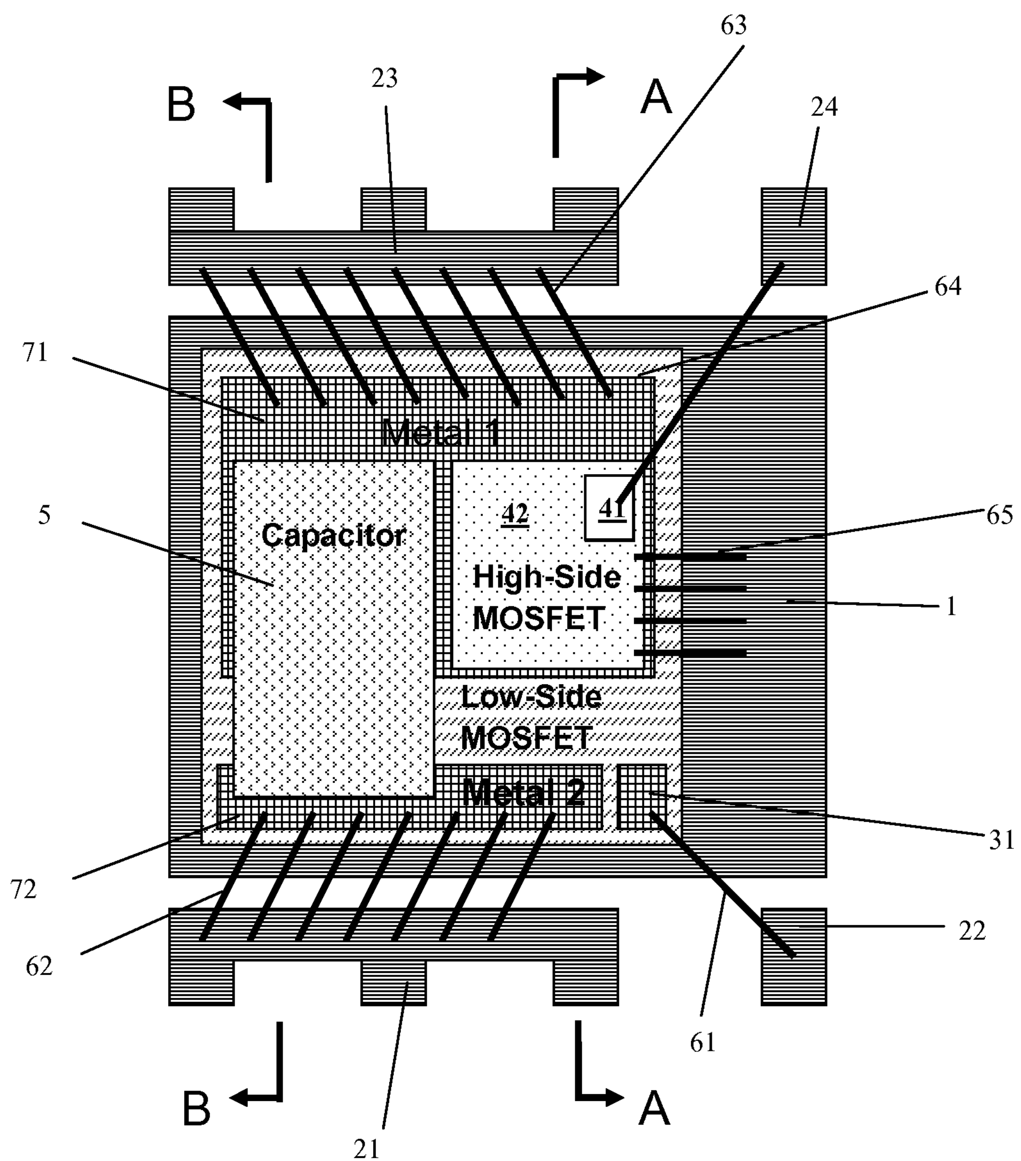
FIG. 3A is a top view of encapsulation structure in an embodiment for the power converter of this invention.
Figure 3B:
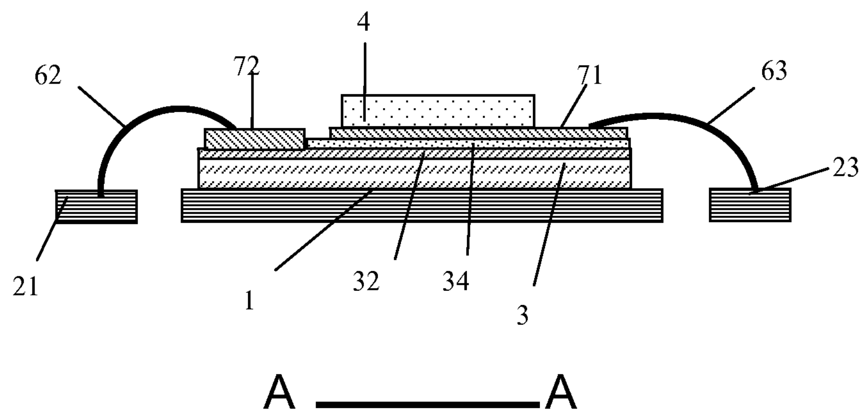
FIG. 3B is the sectional view of the encapsulation structure along direction A-A in FIG. 3A.

FIG. 3A is the top view of Embodiment 1 provided in this invention. FIG. 3B is the cross sectional view along direction A-A in FIG. 3A. This package comprises the lead frame with a die pad 1 and a plurality of pins separated from the die pad 1 without electrical connection. Based on the circuit diagram of power converter shown in FIG. 1, the pins comprise low-side source electrode pin 21, low-side gate pin 22, high-side drain electrode pin 23, and high-side gate pin 24. Low-side MOSFET 3 is bonded onto die pad 1, to form electrical connection between the bottom drain electrode (not shown in the figure) of low-side MOSFET 3 and die pad 1. Top gate 31 of low-side MOSFET 3 is connected to low-side gate pin 22 via connecting wire 61 to form the electrical connection between the gate 31 of low-side MOSFET 3 and low-side gate pin 22. A first metallic area formed with metal layer 71 is disposed on a first portion of the top surface of MOSFET 3 on top of a dielectric layer 34 overlaying a portion of the top source electrode 32 of the low-side MOSFET 3. The dielectric layer 34 electrically insulates the first metallic layer 71 from the underneath source electrode 32 and a second metallic area formed with second metallic layer 72 disposed on a second portion different from the first portion of the top surface of MOSFET 3, whereas the second metallic layer 72 is electrically connected to or forms a portion of the source electrode 32 of MOSFET 3. The low-side source electrode 32, the dielectric layer 34 and the first metal layer 71 constitute a capacitor. Also, bond wire 62 is connected to low-side source electrode pin 21 to form the electrical connection between the source electrode of low-side MOSFET 3 and low-side source electrode pin 21. Top gate electrode 31 is disposed on a separated portion of the top surface of MOSFET 3 electrically connecting to gate pin 21 with bond wire 61. The high-side MOSFET 4 is bonded onto the first metallic layer 71 to form the electrical connection between the bottom drain electrode (not shown in the figure) of high-side MOSFET 4 and the first metallic layer 71. The size of the high-side MOSFET 4 is smaller than that of the first metallic layer 71, so it only covers partial surface of the first metallic layer 71. The first metallic layer 71 connects to high-side drain electrode pin 23 by using a plurality of bond wires 63, to form the electrical connection between the bottom drain electrode of high-side MOSFET 4 and the high-side drain electrode pin 23. The top gate 41 of high-side MOSFET 4 is connected to high-side gate pin 24 via bond wire 64, to form the electrical connection between the gate 41 of high-side MOSFET 4 and high-side gate pin 24. The Top source electrode 42 of high-side MOSFET 4 is directly bonded to the die pad 1 by using a plurality of bond wires 65, to form the electrical connection between source electrode 42 of high-side MOSFET 4 and die pad 1. Meanwhile, because electrical connection is also formed between the bottom drain electrode of low-side MOSFET 3 and die pad 1, the electrical connection is formed between source electrode 42 of high-side MOSFET 4 and bottom drain electrode of low-side MOSFET 3. Therefore, the structure has become the power converter with two N-channel MOSFET connections as shown in FIG. 1.

Figure 3C:
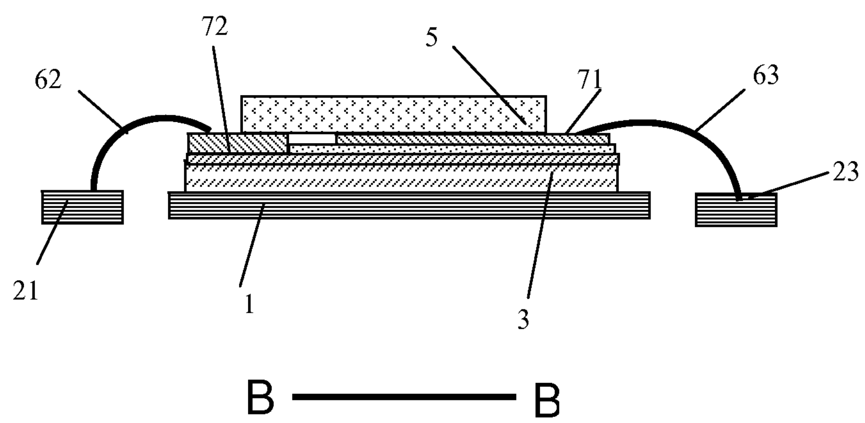
FIG. 3C is the sectional view of the encapsulation structure along direction B-B in FIG. 3A.

Refer to FIGS. 3A and 3C where FIG. 3C is the sectional view along direction B-B in FIG. 3A. One electrode of capacitor 5 is bonded onto a portion of the second metallic layer 72 to form the electrical connection with source electrode of low-side MOSFET 3. The other electrode of capacitor 5 is bonded onto a portion of the first metallic layer 71 to form the electrical connection with the drain electrode of high-side MOSFET 4. Therefore, in comparison with the circuit diagram shown in FIG. 1, the structure successfully configures the capacitor horizontally in parallel with the source electrode (external terminal Gnd) of low-side MOSFET 3 and the drain electrode (external terminal Vin) of high-side MOSFET 4. Finally a plastic encapsulation may be applied to the package thus obtaining a semiconductor package with built-in bypass capacitor for power converter application. As the bypass capacitor is enclosed within the semiconductor encapsulation, the position of this bypass capacitor is closely disposed to the two N-channel MOSFETs with the minimum parasitic inductance thus effectively improving the performance of the power converter.

In the Embodiment 1, during the process of plastic encapsulation, a portion of the lead frame bottom may be exposed, to improve the thermal performance of semiconductor package and reduce its thickness.

Embodiment 2

Figure 4A:
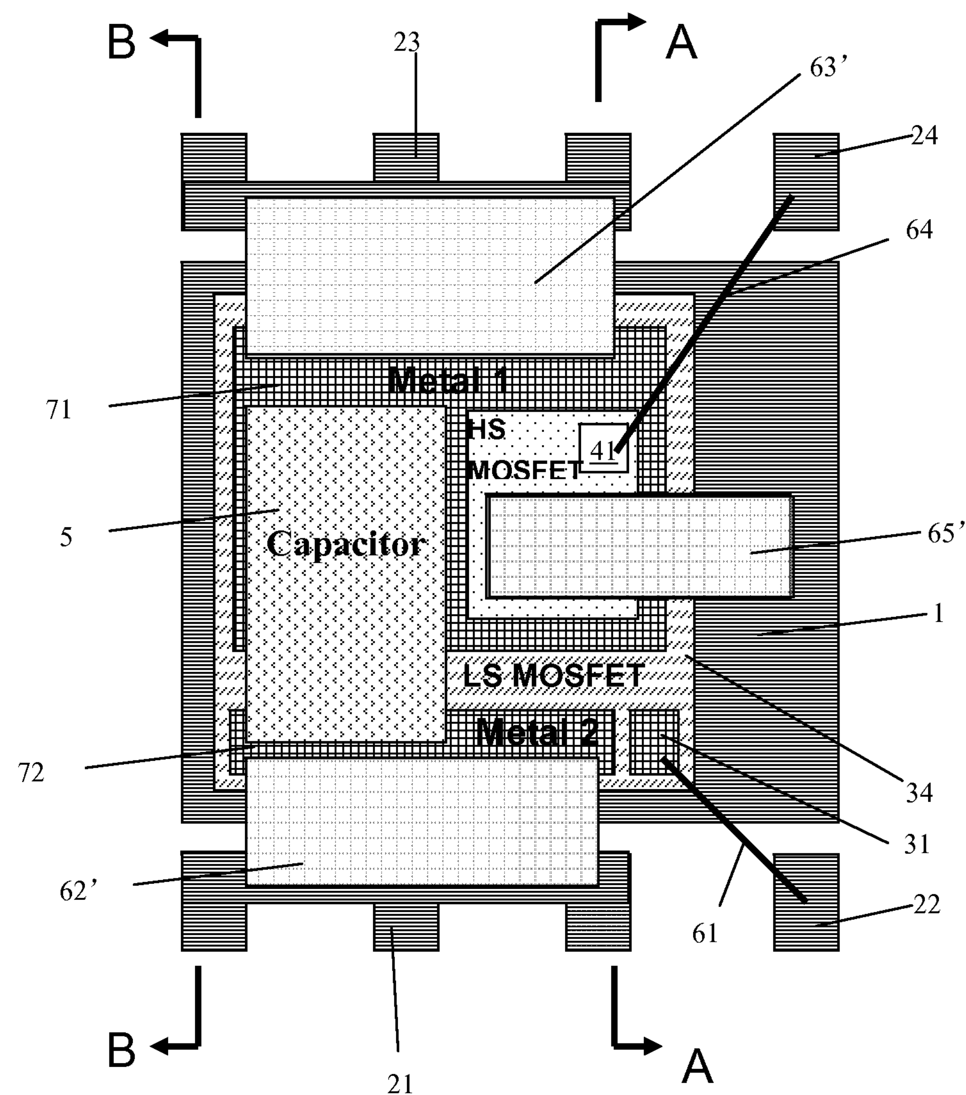
FIG. 4A is a top view of an encapsulation structure in another embodiment for the power converter of this invention.
Figure 4B:
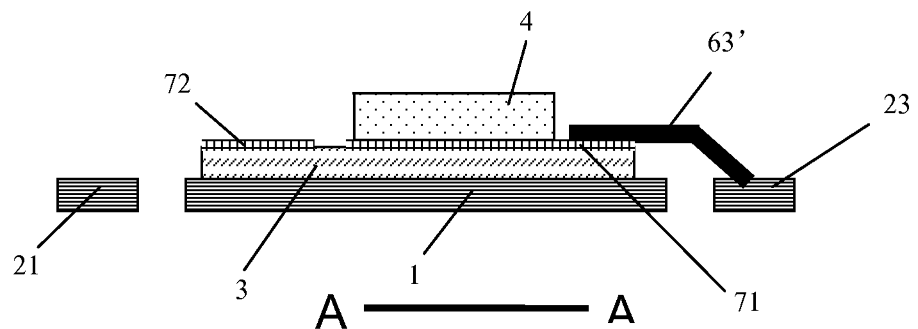
FIG. 4B is the sectional view of the encapsulation structure along direction A-A in FIG. 4A.
Figure 4C:
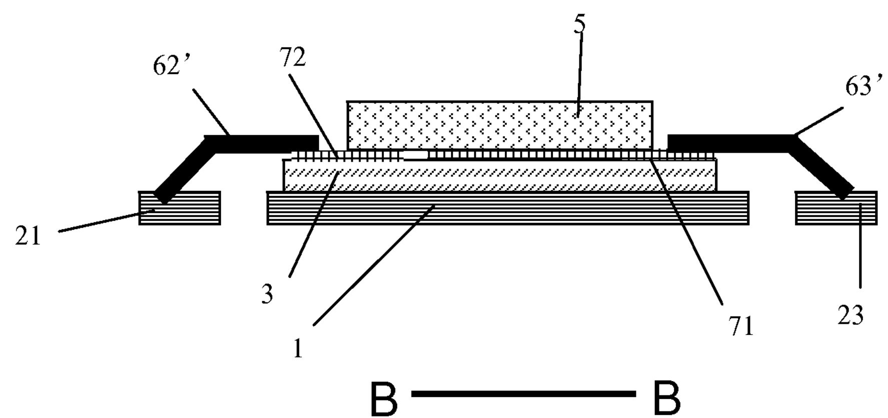
FIG. 4C is the sectional view of the encapsulation structure along direction B-B in FIG. 4A.

FIG. 4A is the top view in the Embodiment 2 provided in this invention. FIG. 4B is the sectional view along direction A-A in FIG. 4A. FIG. 4C is the sectional view along direction B-B in FIG. 4A. The encapsulation structure described in this Embodiment 2 is similar to that in the Embodiment 1. The differences comprise: a metallic connecting plate 62' (or similar metallic connector) is used in this embodiment other than a plurality of connecting leads 62 in the Embodiment 1, to connect the first metallic layer 71 and the low-side source electrode pin 21; a metallic connecting plate 63' is used in this Embodiment other than a plurality of connecting leads 63 in the Embodiment 1, to connect the second metallic layer 72 and the high-side drain electrode pin 23; a metallic connecting plate 65' is used in this Embodiment other than a plurality of connecting leads 65 in the Embodiment 1, to connect the top source electrode 42 of high-side MOSFET 4 and the die pad 1.

Similarly, the encapsulation structure in this Embodiment 2 can realize that the power converter and its bypass capacitor can be encapsulated into a semiconductor encapsulation, to form the power converter with built-in bypass capacitor with low parasitic inductance, thus effectively improving the performance of power converter.

In this Embodiment 2, metallic connecting plates are used to make the proper electrical connections, and the capacitor is located at the highest position in the whole encapsulation structure. Its top surface may be on the same plane or slightly higher than the top surface of high-side MOSFET 4. In the process of plastic encapsulation, the bottom of this encapsulation structure, the top surface of the capacitor, and the metallic connecting plate 65', may be exposed to improve the thermal performance of semiconductor encapsulation and effectively reduce its thickness.

Embodiment 3

The encapsulation structure provided in this Embodiment 3 is systematically similar to that in the Embodiment 1. Its core structure is also a high-side MOSFET chip stacked onto a low-side MOSFET chip. But in this Embodiment, a capacitor with vertical structure is used whose two electrodes are respectively located on its top surface and bottom surface.

Figure 5A:
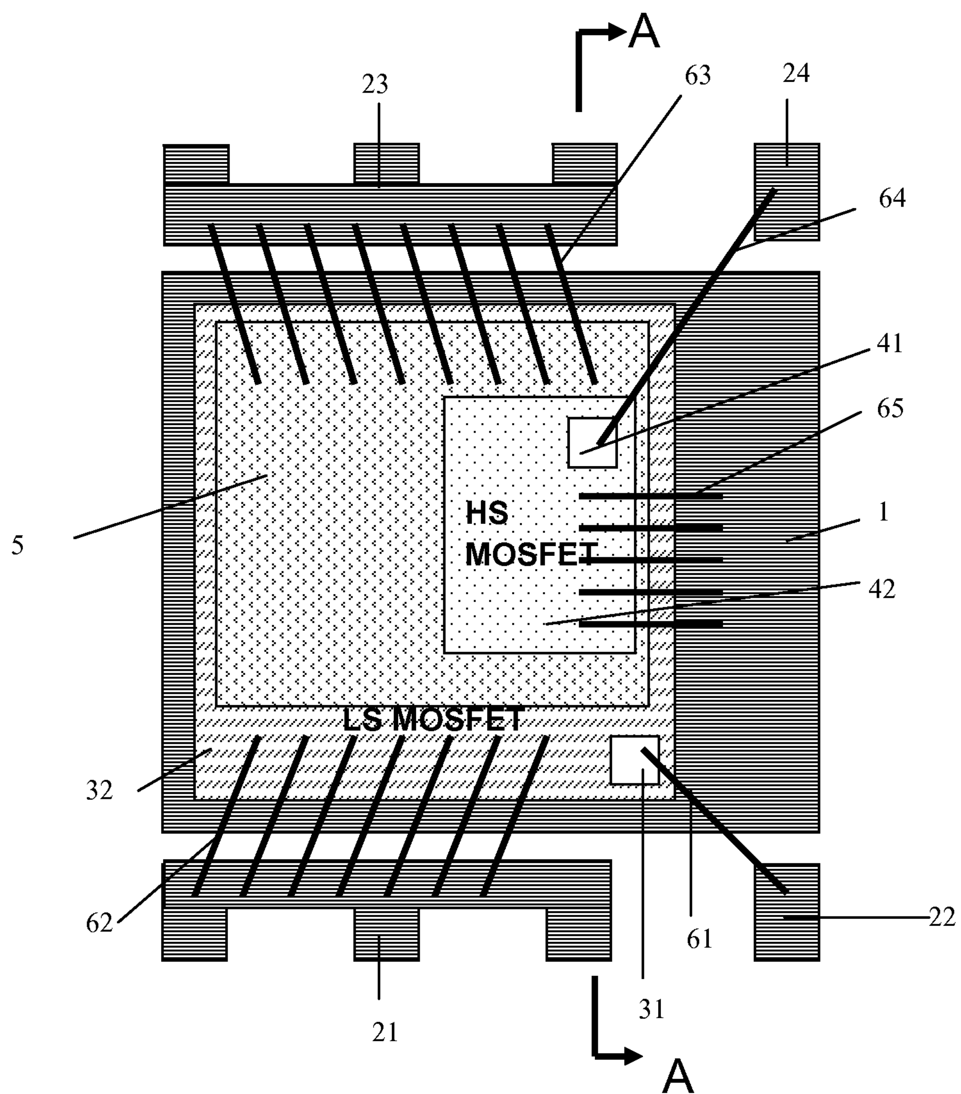
FIG. 5A is a top view of the encapsulation structure in another embodiment for the power converter of this invention.
Figure 5B:
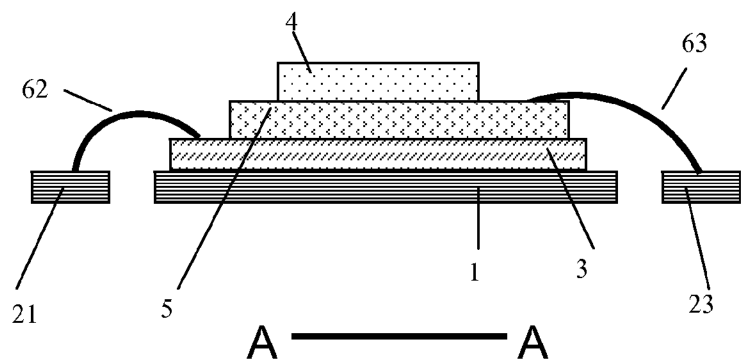
FIG. 5B is the sectional view of the encapsulation structure along direction A-A in FIG. 5A.

FIG. 5A is the top view of Embodiment 3 provided in this invention. FIG. 5B is the sectional view along direction A-A in FIG. 5A. Whereas, the structure of lead frame is shown in FIG. 1, including the die pad 1 and a plurality of pins separated from die pad 1 without electrical connections. These pins comprise low-side source electrode pin 21, low-side gate pin 22, high-side drain electrode pin 23, and high-side gate pin 24. The low-side MOSFET 3 is bonded/attached onto die pad 1, to form electrical connection between the bottom drain electrode (not shown in the figure) and die pad 1. Top gate 31 of low-side MOSFET 3 is bonded to the low-side gate pin 22 via a plurality of connecting lead 61, to form the electrical connection. Top source electrode 32 of low-side MOSFET 3 is bonded to low-side source electrode pin 21 via connecting lead 62, to form the electrical connection.

The vertical capacitor 5 is bonded onto the top source electrode 32 of low-side MOSFET 3, to form the electrical connection between the bottom electrode of capacitor 5 and top source electrode of low-side MOSFET 3. The high-side MOSFET 4 is bonded onto the top surface of this vertical capacitor 5, to form the electrical connection between the bottom drain electrode of high-side MOSFET 4 and the top electrode of this vertical capacitor 5. The top surface electrode of vertical capacitor 5 is connected to high-side drain electrode pin 23 by using a plurality of connecting lead 63, to form the electrical connection between the bottom drain electrode of high-side MOSFET 4 and high-side drain electrode pin 23. Top gate 41 of high-side MOSFET 4 is bonded to high-side gate pin 24 via connecting lead 64, to form the electrical connection. Top source electrode 42 of high-side MOSFET 4 is directly bonded to the die pad 1 by using a plurality of connecting leads 65, to form the electrical connection between source electrode 42 of high-side MOSFET 4 and die pad 1. Meanwhile because the electrical connection is also formed between the bottom drain electrode of low-side MOSFET 3 and die pad 1, the electrical connection is thus realized between source electrode 42 of high-side MOSFET 4 and bottom drain electrode of low-side MOSFET 3.

In conclusion, it is clearly shown in FIG. 5B that in this Embodiment 3, high-side MOSFET chip 4 is stacked onto low-side MOSFET chip 3, and a vertical capacitor 5 is sandwiched between the two chips, with connections of the top electrode of vertical capacitor 5 to the drain electrode of high-side MOSFET 4 and the bottom electrode of the vertical capacitor 5 to the source electrode of low-side MOSFET 3. In comparison with the circuit diagram shown in FIG. 1, the encapsulation structure provided in this Embodiment achieves the connection between two N-channel MOSFET chips, to form the power converter and connect bypass capacitor in parallel with the source electrode (external side Gnd) of low-side MOSFET 3 and the drain electrode (external side Vin) of high-side MOSFET 4. the bypass capacitor is closely disposed to the two N-channel MOSFETs, with minimum parasitic inductance, thus effectively improving the performance of the power converter. In the process of plastic encapsulation, the bottom of this encapsulation structure may be exposed, to improve the thermal performance of semiconductor encapsulation while reducing its thickness.

Furthermore, in the another preferred embodiment, the top source electrode of MOSFET 3 is connected to the low-side pin 21 by using metallic connecting plate other than connecting lead 62. The top electrode of vertical capacitor 5 is connected to high-side drain electrode pin 23 by using metallic connecting plate other than connecting lead 63. The top source electrode 42 of high-side MOSFET 4 is connected to die pad 1 by using metallic connecting plate other than connecting lead 65. In the process of plastic encapsulation, the bottom of this encapsulation structure and the top surface of the metallic connecting plate may be exposed to improve the thermal performance of semiconductor encapsulation and effectively reduce its thickness. The encapsulation structure in this Embodiment 3 provides a power converter with its bypass capacitor encapsulated into a same semiconductor package, forming a power converter with built-in bypass capacitor with reduced parasitic inductance, thus effectively improving the performance of power converter.

Furthermore, in yet another preferred embodiment, the low-side MOSFET 3 and the vertical capacitor 5 may be integrated on chip level. In one embodiment, the source electrode of low-side MOSFET chip may also function as an electrode of the vertical capacitor. In another embodiment, the low-side MOSFET source electrode, a dielectric layer disposed over the low-side MOSFET source electrode and a first metal layer disposed over the dielectric layer as that shown in FIGS. 3B and 3C constitute a vertical capacitor. In another embodiment, the low-side MOSFET source electrode, a dielectric layer disposed over the low-side MOSFET source electrode and the drain electrode of high-side MOSFET constitute a vertical capacitor.

Embodiment 4

Figure 2:
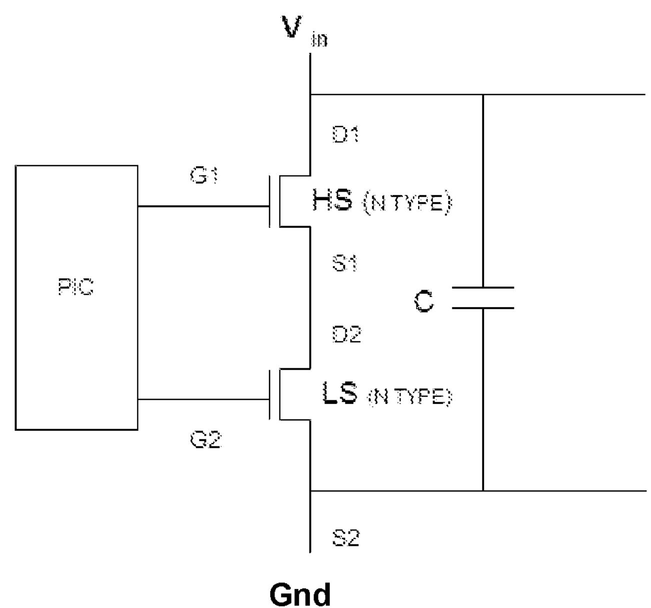
FIG. 2 is a circuit diagram of a DC-DC converter in this invention.

On the basis of Embodiments 1~3 disclosed above, the semiconductor encapsulation structure provided by this invention may further comprise a power controller (PIC) to form a DC-DC converter. FIG. 2 is the circuit diagram of DC-DC converter with the PIC chip connected to the gate of high-side MOSFET and the gate of low-side MOSFET.

Figure 6:
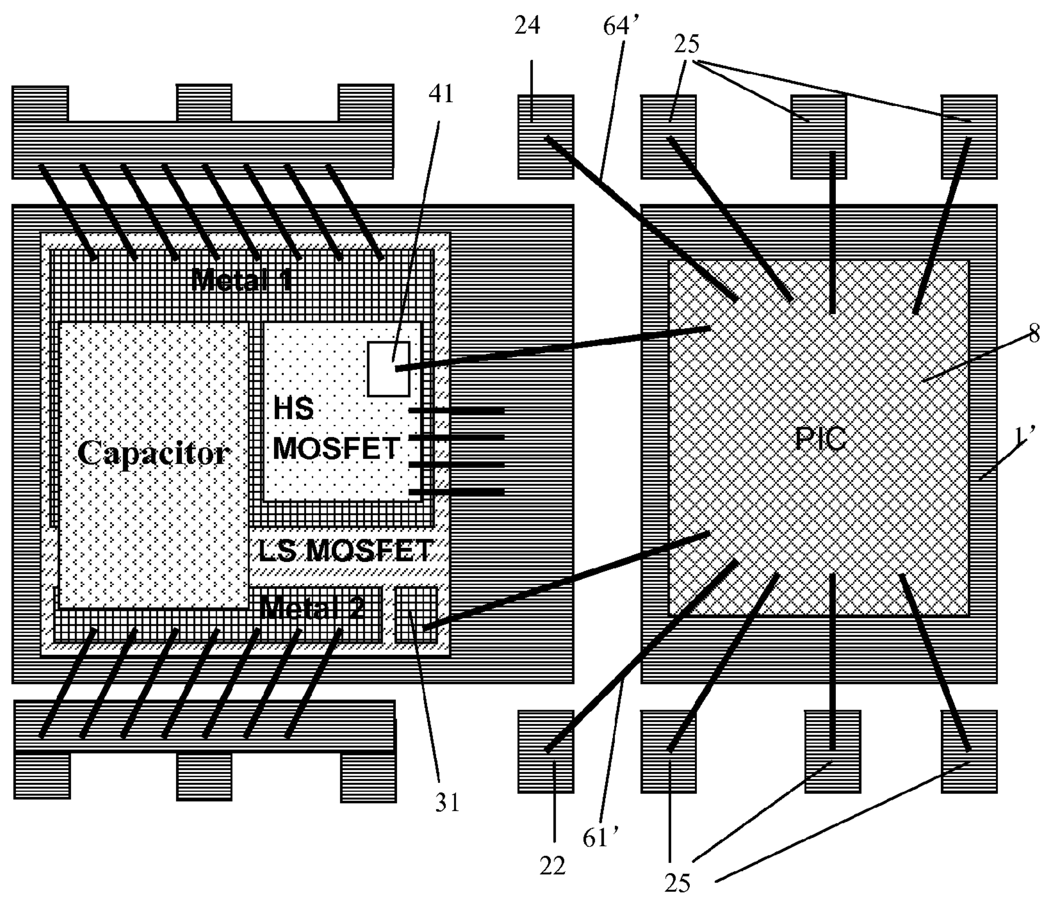
FIG. 6 is a top view of the encapsulation structure of DC-DC converter that is formed and based on the power converter shown in FIG. 3A.

Referring to FIG. 6, of a DC-DC converter with PIC chip comprised in the encapsulation structure based on Embodiment 1. in this embodiment, the lead frame additionally comprises one die pad 1' and a plurality of PIC pins 25. PIC chip 8 is bonded onto the die pad 1', and PIC chip 8 is connected to different PIC pins 25 by using a plurality of connecting leads. PIC chip 8 is connected to low-side gate pin 22 by using a plurality of connecting leads 61'. This PIC chip is connected to high-side gate pin 24 by using connecting lead 64'. The plastic encapsulation finally performed provides a semiconductor encapsulation structure of DC-DC converter shown in FIG. 2. This encapsulation structure comprises two N-channel MOSFET chips, a bypass capacitor, and a PIC chip. Further the bypass capacitor is enclosed closely to the two N-channel MOSFETs, with minimum parasitic inductance, thus effectively improving the performance of DC-DC converter.

For the semiconductor encapsulation structure provided in this Embodiment, in the process of plastic encapsulation, the bottom of this encapsulation structure can be exposed, to improve the thermal performance of semiconductor encapsulation and reduce its thickness. Further embodiments base on embodiments 2 and 3 may be constructed in similar fashion.

Embodiment 5

Figure 7A:
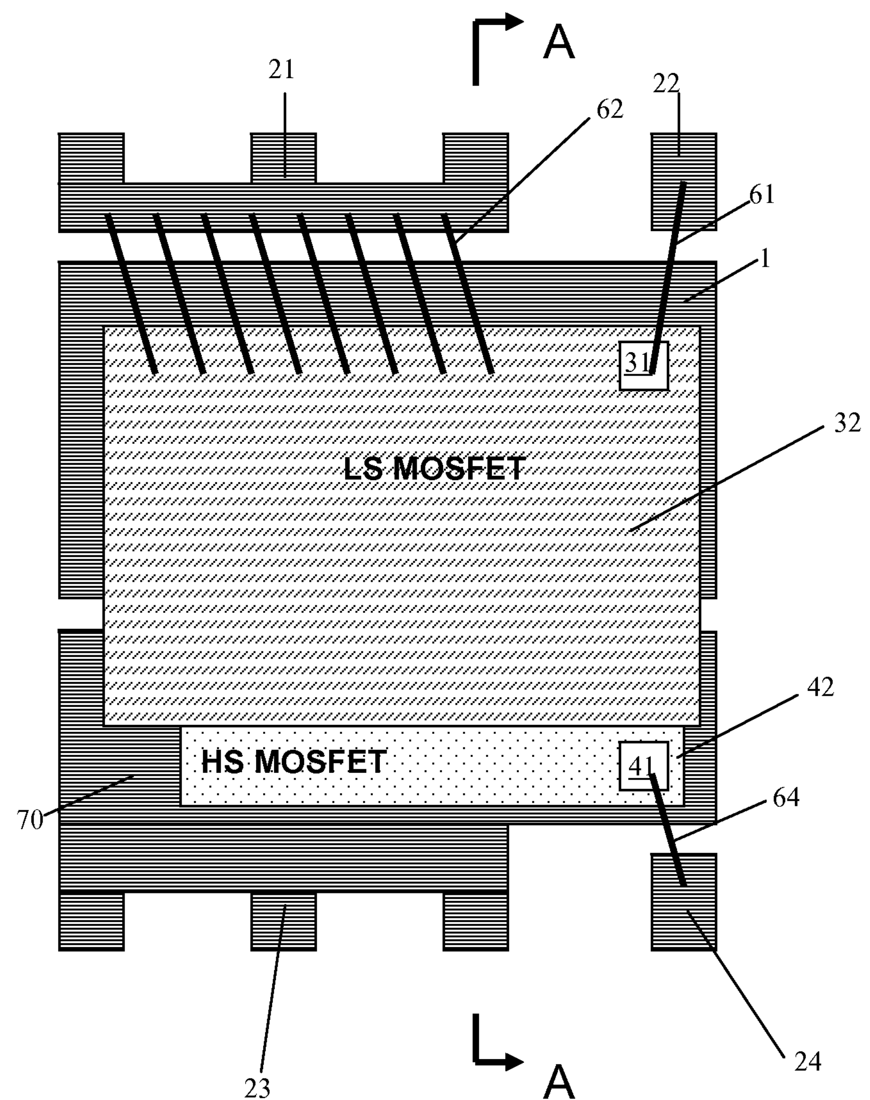
FIG. 7A is a top view of the encapsulation structure in another embodiment for the power converter of this invention.
Figure 7B:
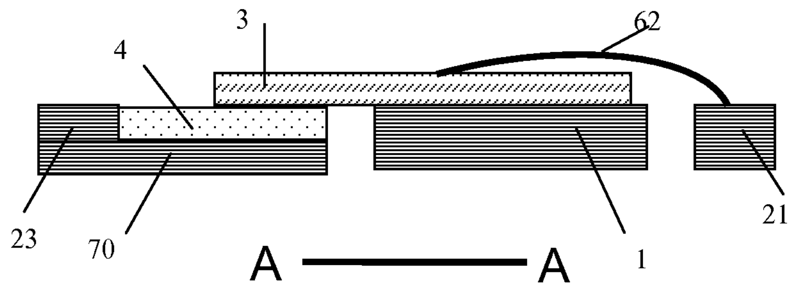
FIG. 7B is the sectional view of the encapsulation structure along direction A-A in FIG. 7A.

In this embodiment, the low-side MOSFET chip is stacked onto the high-side MOSFET chip. FIG. 7A is the top view of Embodiment 5 provided in this invention. FIG. 7B is the sectional view along direction A-A in FIG. 7A. This encapsulation comprises a lead frame with a die pad 1 and a plurality of pins separated from the die pad 1 without electrical connection. Based on the circuit diagram of power converter shown in FIG. 1, the pins comprise low-side source electrode pin 21, low-side gate pin 22, high-side drain electrode pin 23, and high-side gate pin 24. The high-side MOSFET 4 is bonded onto an extended area 70 of the high-side drain electrode pin 23 to form the electrical connection between the bottom drain electrode of high-side MOSFET 4 and high-side drain electrode pin 23. The top gate of high-side MOSFET 4 is connected to high-side gate pin 24 via connecting lead 64, to form the electrical connection between the gate 41 of high-side MOSFET 4 and high-side gate pin 24. In this embodiment, only a part of bottom drain electrode area of low-side MOSFET 3 is bonded/attached onto die pad 1, to form the electrical connection. The other part of bottom drain electrode area of low-side MOSFET 3 is extended to the outside of die pad 1, and is stacked above the top source electrode area of high-side MOSFET 4. So the electrical connection forms between the drain electrode of low-side MOSFET 3 and the source electrode of high-side MOSFET 4. In this embodiment, the extended area 70 has a top surface step down substantially a depth of the thickness of high-side MOSFET 4 from the top surface of die pad 1 therefore the top source electrode of high-side MOSFET 4 is substantially coplanar to the top surface of die pad 1. The high-side drain electrode pin 23 may further comprise a top surface substantially coplanar to the top surface of die pad 1. The portion above the high-side drain electrode pin 23 extended from the bottom drain electrode of low-side MOSFET 3 is separated and insulated from high-side drain electrode pin 23 without electrical connection. Top gate of low-side MOSFET 3 is connected to low-side gate pin 22 via connecting lead 61, to form the electrical connection. Top source electrode of low-side MOSFET 3 is connected to low-side source electrode pin 21 via connecting lead 62, to form the electrical connection. Therefore, the structure has become a semiconductor package with two N-channel MOSFET connections as shown in FIG. 1 for power converter application. Alternatively connecting lead 62 may be replaced by metallic connecting plate 62' as shown in FIGS. 4A and 4C.

Embodiment 6

Figure 8A:
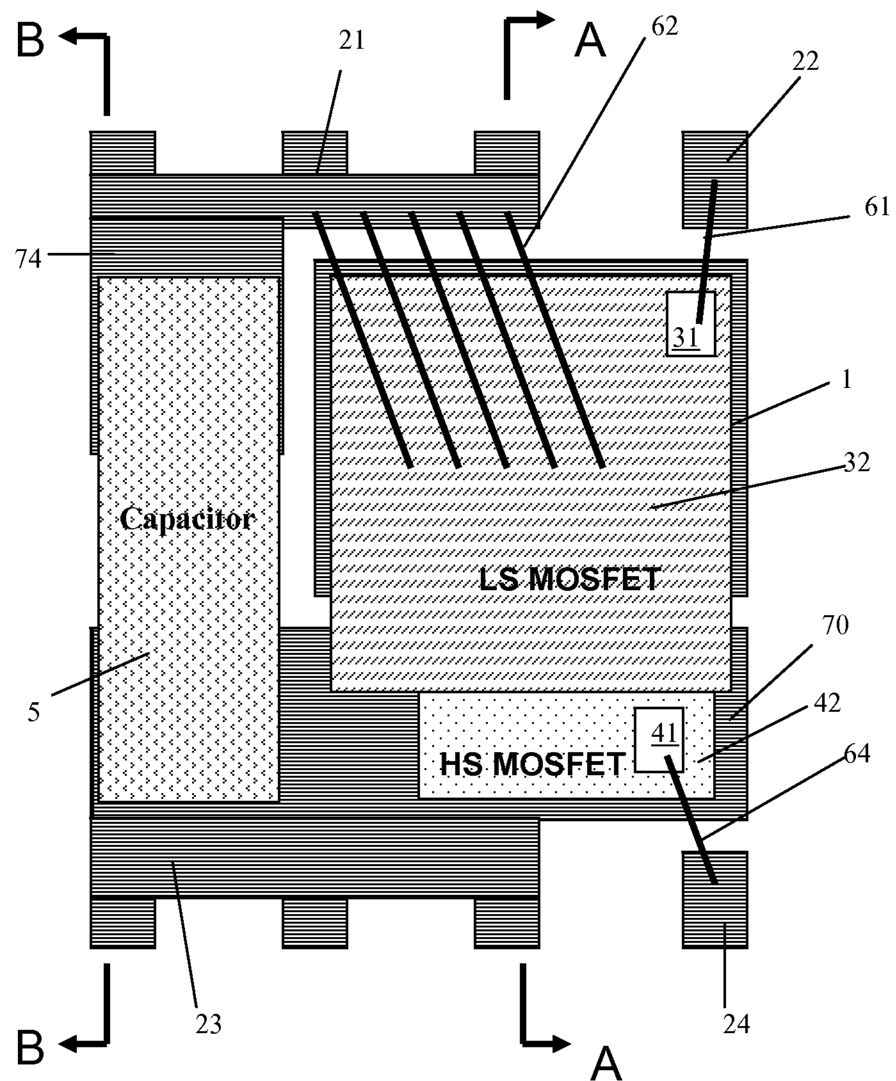
FIG. 8A is a top view of the encapsulation structure in another embodiment for the power converter of this invention.
Figure 8B:
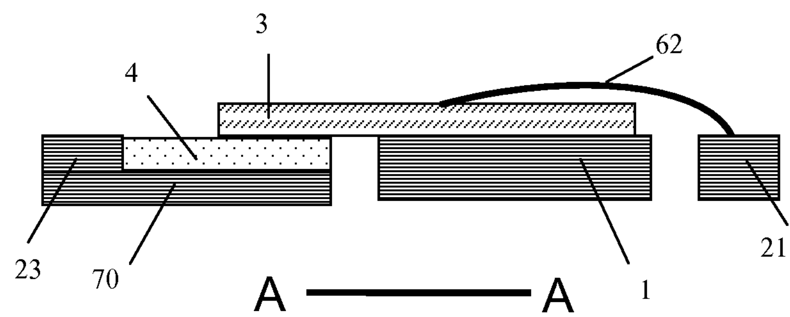
FIG. 8B is the sectional view of the encapsulation structure along direction A-A in FIG. 8A.
Figure 8C:
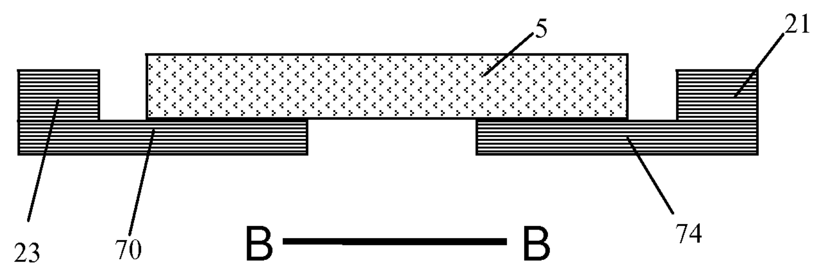
FIG. 8C is the sectional view of the encapsulation structure along direction B-B in FIG. 8A.

The package of embodiment 5 may further comprise an optional bypass capacitor 5 disposed side by side to the two staking MOSFET chips as shown in FIGS. 8A and 8B, whereas FIG. 8B is the sectional view along direction B-B in FIG. 8A. One electrode of optional capacitor 5 is bonded onto the low-side source electrode pin 21, to form the electrical connection with the source electrode of low-side MOSFET 3. The other electrode of optional capacitor 5 is bonded onto high-side drain electrode pin 23, to form the electrical connection with the drain electrode of high-side MOSFET 4. In one embodiment, the optional capacitor 5 is disposed side by side to the two staking MOSFET chips with a first electrode connected onto the extended area 72 of low-side source electrode pin 21. In another embodiment the optional capacitor 5 is disposed side by side to the two staking MOSFET chips with a second electrode connected onto an extended area 70 of high-side drain electrode pin 23. Extended area 72 may have a step down similar or different to that of extended area 70. In another embodiment the extended area 72 has a step down from a top surface of the low-side MOSFET chip substantially the same as a thickness of the optional capacitor 5. Therefore, in comparison with the circuit diagram shown in FIG. 1, the structure configures the capacitor horizontally connected in parallel with the source electrode (external side Gnd) of low-side MOSFET 3 and the drain electrode (external side Vin) of high-side MOSFET 4. The structure is finally encapsulated within a plastic encapsulation thus providing a power converter with built-in bypass capacitor. As the bypass capacitor for this power converter is set inside the semiconductor encapsulation, the bypass capacitor is closely placed to the two N-channel MOSFET with minimum parasitic inductance thus effectively improving the performance of the power converter. In the Embodiment 6, in the process of plastic encapsulation, the bottom of this encapsulation structure may be exposed to improve the thermal performance of semiconductor encapsulation and reduce its thickness.

Embodiment 7

The package of embodiment 5 may further comprise an optional bypass capacitor 5 staking onto the two staking MOSFET chips. The encapsulation structure provided in this Embodiment 7 is systematically similar to that in the Embodiment 5. Its core structure is also a high-side MOSFET chip stacked onto a low-side MOSFET chip. But in this Embodiment, a capacitor with vertical structure is used, and both electrodes of the capacitor are located on its top surface and bottom surface respectively.

Figure 9A:
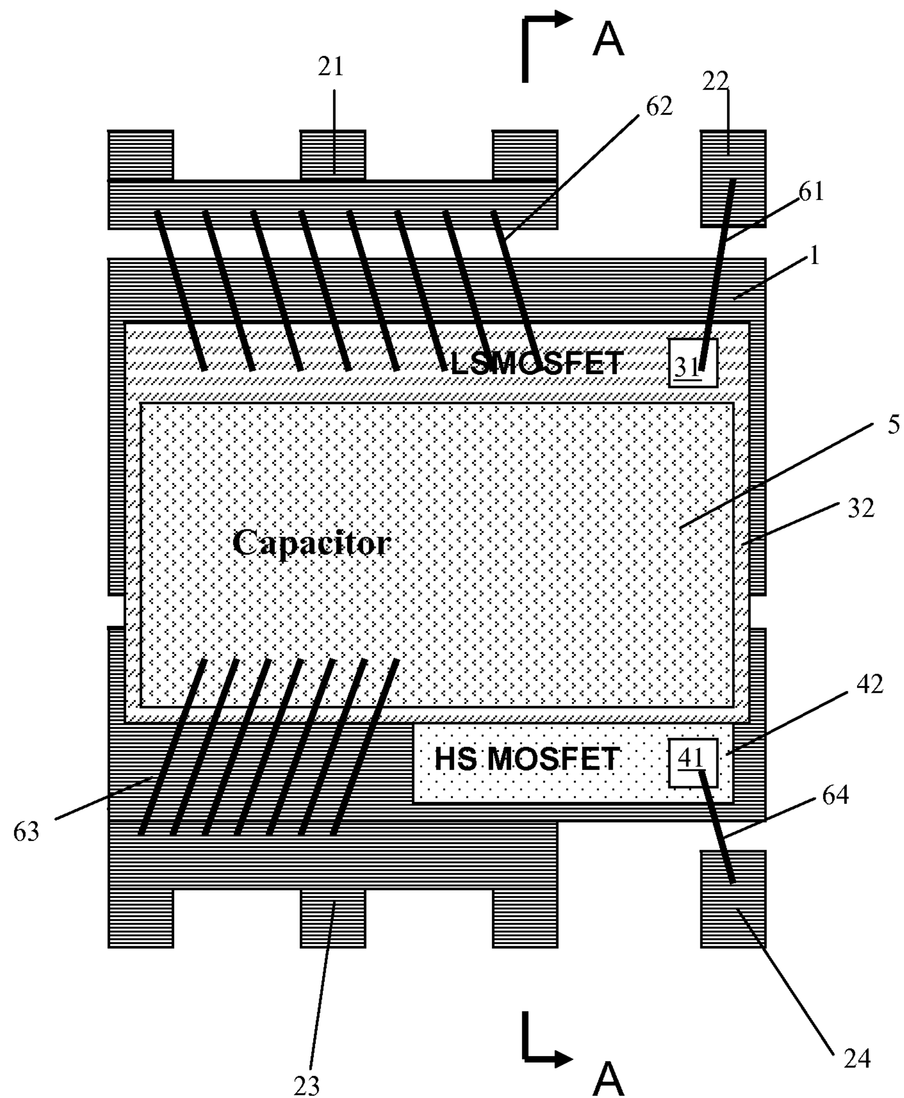
FIG. 9A is a top view of the encapsulation structure in another embodiment for the power converter of this invention.
Figure 9B:
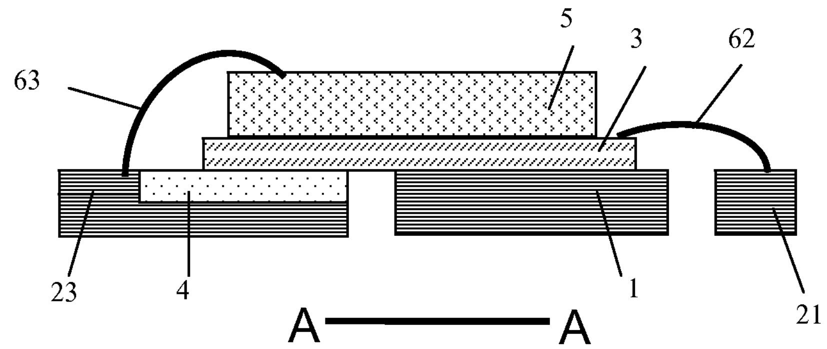
FIG. 9B is the sectional view of the encapsulation structure along direction A-A in FIG. 9A.

FIG. 9A is the top view of Embodiment 7 provided in this invention. FIG. 9B is the sectional view along direction A-A in FIG. 9A. The optional vertical capacitor 5 may be bonded/attached onto the top source electrode area 32 of low-side MOSFET 3, to form the electrical connection between the bottom electrode of vertical capacitor 5 and top source electrode of low-side MOSFET 3. Top electrode of vertical capacitor 5 is connected/bonded to high-side drain electrode pin 23 by using connecting lead 63, to form the electrical connection. Meanwhile, because the electrical connection is formed between drain electrode of high-side MOSFET 4 and high-side drain electrode lead 23, thus realizing the electrical connection between the top electrode of vertical capacitor and the drain electrode of high-side MOSFET 4.

As clearly displayed in FIG. 9B, low-side MOSFET chip 3 is stacked onto high-side MOSFET chip 4, and a vertical capacitor 5 is used to stack onto low-side MOSFET chip 3. The top electrode of vertical capacitor 5 is connected to the drain electrode of high-side MOSFET 4 by using connecting lead 63, and the bottom electrode of vertical capacitor 5 is stacked onto the source electrode of low-side MOSFET 3. In comparison with the circuit diagram shown in FIG. 1, the encapsulation structure provided in this Embodiment successfully makes the connection between two N-channel MOSFET chips, to form the power converter and connect bypass capacitor in parallel with source electrode (external side Gnd) of low-side MOSFET 3 and drain electrode (external side Vin) of high-side MOSFET 4. Finally, it is possible to encapsulate the power converter and its bypass capacitor into a semiconductor encapsulation only by performing plastic encapsulation for the whole lead frame, making the bypass capacitor the closest to two N-channel MOSFET, with the minimum parasitic inductance, thus effectively improving the performance of the power converter. In the process of plastic encapsulation, the bottom of this encapsulation structure can be exposed, to improve the thermal performance of semiconductor encapsulation and reduce its thickness.

Furthermore, based on above provided encapsulation structure, in the another preferred embodiment, the top source electrode of MOSFET 3 and low-side pin 21 are connected by the metallic connecting plate other than connecting lead 62. The top electrode of vertical capacitor 5 is bonded onto to high-side drain electrode pin 23 by using metallic connecting plate other than connecting lead 63. In the process of plastic encapsulation, the bottom of this encapsulation structure, the top surface of the metallic connecting plate and the capacitor may be exposed to improve the thermal performance of semiconductor encapsulation while effectively reducing its thickness. The encapsulation structure in this Embodiments 6 and 7 provide power converter with its bypass capacitor encapsulated into a same semiconductor package, forming a power converter with built-in bypass capacitor with reduced parasitic inductance, thus effectively improving the performance of power converter.

Furthermore, in yet another preferred embodiment, the low-side MOSFET 3 and the vertical capacitor 5 may be integrated to on chip level. In one embodiment, the source electrode of low-side MOSFET chip may also function as an electrode of the vertical capacitor. In another embodiment, the low-side MOSFET source electrode, a dielectric layer disposed over the low-side MOSFET source electrode and a first metal layer disposed over the dielectric layer as that shown in FIGS. 3B and 3C constitute a vertical capacitor.

Embodiment 8

On the basis of Embodiments 5~7 disclosed above, the semiconductor encapsulation structure provided by this invention may further comprise a power controller (PIC) to form a DC-DC converter. FIG. 2 is the circuit diagram of DC-DC converter with the PIC chip connected to the gate of high-side MOSFET and the gate of low-side MOSFET.

Figure 10:
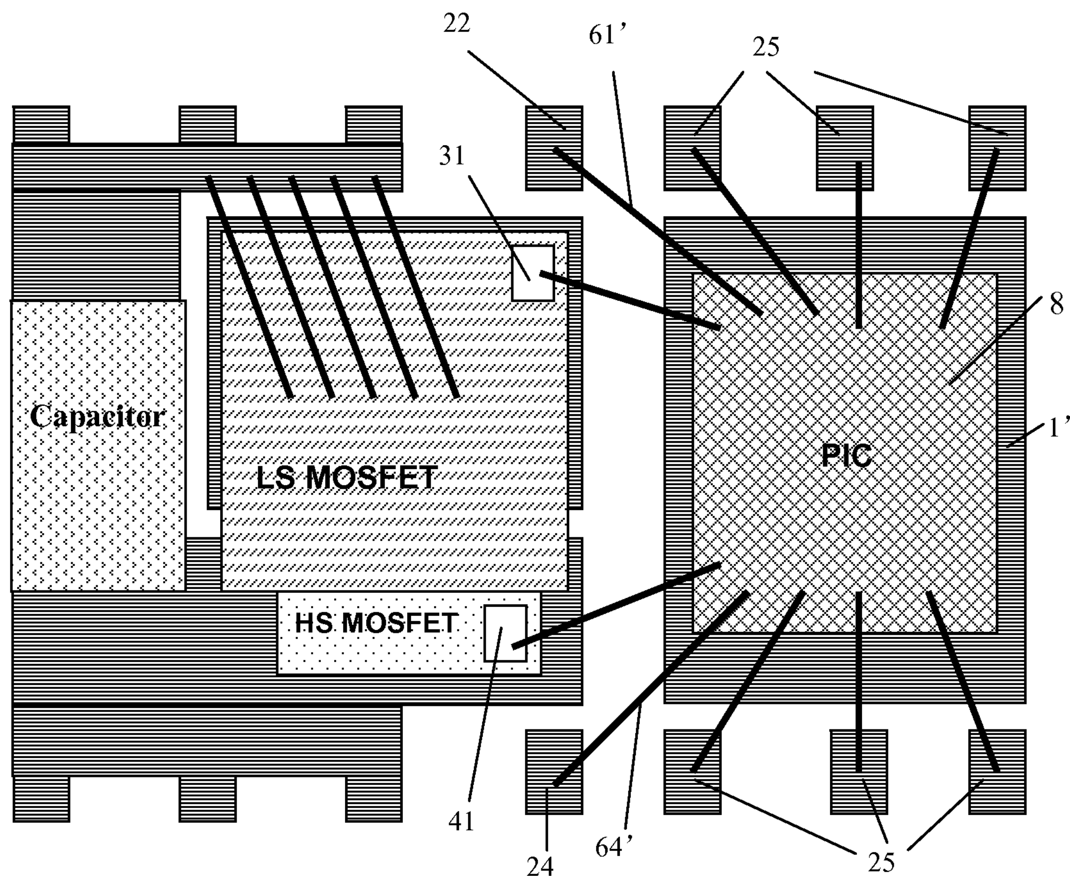
FIG. 10 is a top view of the encapsulation structure of DC-DC converter that is formed and based on the power converter shown in FIG. 8A.

FIG. 10 is a DC-DC converter with PIC chip enclosed in the encapsulation structure based on Embodiment 6. In this embodiment, the lead frame additionally comprises one die pad 1' and a plurality of PIC pins 25. PIC chip 8 is bonded onto the die pad 1', and PIC chip 8 is connected to different PIC pins 25 by using a plurality of connecting leads. PIC chip 8 is connected to the low-side gate pin 22 by using a plurality of connecting leads 61'. This PIC chip is connected to high-side gate pin 24 by using connecting lead 64'. The plastic encapsulation finally performed provides a semiconductor encapsulation structure of DC-DC converter shown in FIG. 2. This encapsulation structure comprises two N-channel MOSFET chips, a bypass capacitor, and a PIC chip. Further the bypass capacitor is enclosed closely to the two N-channel MOSFETs, with minimum parasitic inductance, thus effectively improving the performance of DC-DC converter.

For the semiconductor encapsulation structure provided in this Embodiment, in the process of plastic encapsulation, the bottom of this encapsulation structure can be exposed, to improve the thermal performance of semiconductor encapsulation and reduce its thickness. Further embodiments base on embodiments 7 may be constructed in similar fashion.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

The invention claimed is:

1. A semiconductor package for power converter application comprises:

a lead frame with a die pad and a plurality of pins separated from the die pad without electrical connection;

a high-side MOSFET chip and a low-side MOSFET chip each having a bottom drain electrode, a top gate and a top source electrode respectively, whereas the low-side MOSFET chip is bonded onto the die pad with the bottom drain electrode electrically connected to the die pad;

the high-side MOSFET chip is stack on the low-side MOSFET chip with the bottom drain electrode of high-side MOSFET chip stacking above but insulated from the top source electrode of low-side MOSFET chip.

2. The semiconductor package of claim 1 further comprises:

a capacitor sandwiched between the low-side MOSFET chip and the high-side MOSFET chip.

3. The semiconductor package of claim 1 further comprises:

A dielectric layer disposed on top of the source electrode of low-side MOSFET chip insulating the drain electrode of high-side MOSFET chip from the source electrode of low-side MOSFET chip, whereas the low-side source electrode, the dielectric layer and the high-side drain electrode constitutes a capacitor.

4. The semiconductor package of claim 1 further comprises:

A dielectric layer disposed on top of the source electrode of low-side MOSFET chip, a first metal layer disposed over the dielectric layer, whereas the low-side source electrode, the dielectric layer and the first metal layer constitute a capacitor.

5. The semiconductor package of claim 4 wherein:

The first metal layer has an area smaller than the low-side source electrode and larger than an area of the high-side drain electrode.

6. The semiconductor package of claim 5 further comprises:

a second metallic layer separated from the first metallic layer and connected to the top source electrode of low-side MOSFET chip.

7. The semiconductor package of claim 6 further comprises:

a horizontal capacitor disposed side by side with the high-side MOSFET chip on top of the low-side MOSFET chip, with a first electrode at one end connected onto the first metallic layer and a second electrode at an opposite end connected to the second metallic layer.

8. The semiconductor package of claim 1 further comprises:

a PIC chip in connection with the gates of the low-side MOSFET chip and the high-side MOSFET chip to form a DC-DC converter package.

* * * * *